US008140315B2

(12) United States Patent
Walter et al.

(10) Patent No.: US 8,140,315 B2
(45) Date of Patent: Mar. 20, 2012

(54) TEST BENCH, METHOD, AND COMPUTER PROGRAM PRODUCT FOR PERFORMING A TEST CASE ON AN INTEGRATED CIRCUIT

(75) Inventors: Joerg Walter, Tuebingen (DE); Lothar Felten, Hauset (BE); Christopher Smith, Tamm (DE); Ulrike Schmidt, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 667 days.

(21) Appl. No.: 12/247,529

(22) Filed: Oct. 8, 2008

(65) Prior Publication Data

US 2009/0112554 A1    Apr. 30, 2009

(30) Foreign Application Priority Data

Oct. 26, 2007   (EP) .................................. 07119370

(51) Int. Cl.
*G06F 17/50* (2006.01)
(52) U.S. Cl. .......................................... 703/14; 716/106
(58) Field of Classification Search .................... 703/14
See application file for complete search history.

(56) References Cited

U.S. PATENT DOCUMENTS

| | | | | |
|---|---|---|---|---|
| 6,175,946 | B1 * | 1/2001 | Ly et al. ........................ | 716/103 |
| 6,742,166 | B2 * | 5/2004 | Foster et al. ................... | 716/106 |
| 6,975,976 | B1 * | 12/2005 | Casavant et al. ............... | 703/14 |
| 7,305,636 | B2 * | 12/2007 | Baumgartner et al. ......... | 716/103 |
| 2006/0190874 | A1 * | 8/2006 | Baumgartner et al. .......... | 716/5 |

OTHER PUBLICATIONS

Gott et al, "Functional Formal Verification on Designs of pSeries Microprocessors and Communication Subsystems", IBM Journal of Research and Development, vol. 49, No. 4/5, Jul./Sep. 2005).*
Ghosh et al, "Design for Verification at the Register Transfer Level", Proceedings of the 15th International Conference on VLSI Design, 2002.*
Segev et al, "Evaluating and Comparing Simulation Verification vs. Formal Verification Approach on Block Level Design", Proceedings of the 2004 11th IEEE International Conference on Electronics, Circuits and Systems, 2004.*
Tasiran et al, "Using a Formal Specification and a Model Checker to Monitor and Direct Simulation", DAC 2003, Jun. 2-6, 2003.*
Victor et al, "Functional Verification of the POWER5 Microprocessor and POWER5 Multiprocessor Systems", IBM J. Res.&Dev., vol. 49, No. 4/5, Jul./Sep. 2005.*
Zhu et al, "Design Verification Using Formal Techniques", Proceedings of the 4th International Conference on ASIC, 2001.*

* cited by examiner

*Primary Examiner* — Mary C Jacob
(74) *Attorney, Agent, or Firm* — Adam Steadman; Cynthia Seal

(57) ABSTRACT

The disclosure relates to a test bench, method, and computer program product for performing a test case on an integrated circuit. The test bench may comprise a simulation environment representing an environment for implementing the integrated circuit and a reference model of the integrated circuit, wherein the reference model may be prepared for running within the simulation environment. The test bench may further comprise a device for running a simulation on the reference model within the simulation environment. The reference model may be based on an original reference model provided for a formal verification.

20 Claims, 6 Drawing Sheets

TEST BENCH, METHOD, AND COMPUTER PROGRAM PRODUCT FOR PERFORMING A TEST CASE ON AN INTEGRATED CIRCUIT

RELATED APPLICATION

This application claims priority under 35 U.S.C. §119 to European Patent Application No. 07119370.0 filed Oct. 26, 2007, the entire text of which is specifically incorporated by reference herein.

BACKGROUND OF THE INVENTION

1. Field of the Invention

The various embodiments described herein relate to a test bench for performing a test case on an integrated circuit. Furthermore, the various embodiments relate to a method for performing a test case on an integrated circuit.

2. Description of the Related Art

The main method for a functional hardware verification of an integrated circuit such as a microprocessor is a directed random simulation. The directed random simulation requires a test bench in order to simulate and check the hardware under verification. The test bench is coded in a standard programming language such as C++.

According to the prior art, the test bench is developed together with the hardware model for the device under verification. The test bench includes a reference model, which is developed together with the hardware model. In an early verification stage, the environment is very unstable, since the reference model and the hardware model contain many bugs. A considerable amount of time is required to stabilize the test bench and to find the first bug in the hardware. The required amount of time depends on the complexity of the test bench. During that time, new features are added to the hardware model. The new features cause a constant discrepancy between the hardware design and verification environments of the prior art; specifically, the verification environments lag behind the hardware design. Usually, this discrepancy ends only after the hardware design matures and no more features are added.

FIG. 3 illustrates a schematic timing diagram of a test case according to the prior art. The timing diagram illustrates the aforementioned discrepancy issue. A first curve represents the number of found environment bugs 22. A second curve represents the number of found hardware bugs 24. At the beginning of the verification cycle, all occurring bugs are typically environment bugs 22. After a certain time, the test bench is stable enough so that real hardware bugs 24 can be found. Since the bug rate is usually limited by the resources available for verification, the elapsed time before the first hardware bug 24 is found cannot be reduced arbitrarily.

A known method for addressing this problem is to raise the level of abstraction for coding the test bench. This may be achieved by using dedicated languages for test bench developments, such as the IEEE P1647 e functional verification language from Cadence. Another way to raise the level of abstraction is to automate the creation of the test bench. Such a method is known from U.S. Pat. No. 6,175,946, which describes a method for automatically generating checkers for finding functional defects in a description of a circuit.

Moreover, the article "Using a formal specification and a model checker to monitor and direct simulation" by S. Tasiran, Y. Yu and B. Batson (Proc. 40th Conference on Design Automation 2003, Anaheim, Calif., USA, p. 356) describes a technique for verifying that a hardware design correctly implements a protocol-level formal specification.

Furthermore, a combination of formal verification and random simulation in a single test case is known from the paper "Functional formal verification on designs of pSeries microprocessors and communication subsystems" by R. M. Gott, J. R. Baumgartner, P. Roessler and S. I. Joe (IBM Journal of Research and Development, Volume 49, Number 4/5, 2005). The results of the formal verification and the random simulation can be compared. However, this method depends on the hardware model, and thus the single steps of a test case can be performed only after the corresponding steps in the hardware model have been created.

The above prior art methods have the drawback that the development of the test bench is performed together with the verification of the hardware design. Thus, these prior art methods do not provide a complete solution to the aforementioned discrepancy issue.

FIG. 4 illustrates a schematic diagram of a test bench and a method for performing a test case according to the prior art. A hardware model 30, a reference model 32, and a random simulation environment 34 are provided. The hardware model 30 is generated from a hardware description language (HDL). The HDL describes the logic. The hardware model 30 should be synthesized to a semiconductor chip in a later step. Thus, the hardware model 30 contains the logic written by the hardware designer in order to simulate a function in accordance with the relevant specification. The hardware model 30 can be used for both a formal verification 36 and a random simulation 38 of the random simulation environment 34.

The reference model 32 and the random simulation environment 34 are two distinct models provided for different kinds of verification activities. Both the reference model 32 and the random simulation environment 34 are derived from the same specification that is used to code the hardware model 30, which represents the HDL for synthesizing the semiconductor chip.

The HDL of the reference model 32 is created by a verification team. The reference model 32 is also provided to simulate the function according to the specification. The reference model 32 may comprise elements of a higher level, which are not synthesizable. The HDL of the reference model 32 is written only for checking the hardware model 30.

The formal verification 36 can ensure that the reference model 32 and the hardware model 30 are equivalent. Usually, the reference model 32 describes only a part of the logic of the device under test. Specifically, the reference model 32 typically describes such parts of the logic that are suitable for the formal verification 36. For example, the data path of a microprocessor may be described by the reference model 32. Such part is compared with a corresponding part of the hardware model 30.

The formal verification 36 finds bugs 40 in both the reference model 32 and the hardware model 30. The random simulation 38 finds bugs 42 in both the random simulation environment 34 and the hardware model 30.

The hardware model 30 is simulated randomly by the random simulation 38, and the obtained results are compared with expectation values. The expectation values may be obtained from a database with test values.

The failures in the formal verification may be due to bugs in both the reference model 32 and the real hardware. The failures in the random simulation may be due to bugs in both the random simulation environment 34 and the real hardware.

FIG. 5 illustrates a schematic diagram according to the prior art of the relation between bugs 44 found in the formal environment and bugs 46 found in the simulation environment. The bugs 48 in the real hardware are partially found in the formal environment 44 and partially found in the simulation environment 46. Some bugs may be found by both verification environments, as depicted by the overlapping areas of 44 and 46. A further portion of the real hardware bugs 48 may not be found in either verification environment.

While the prior art implementations permit finding bugs by using verification environments, such verification environments cannot be validated without the use of a hardware model as a design under verification. Thus, as previously discussed, the discrepancy between the hardware design and the verification environments may not be resolved before the hardware design matures, and there is a significant amount of elapsed time before a first hardware bug can be found using the verification environments.

OBJECT OF THE INVENTION

It is an object of the various embodiments described herein to provide an improved test bench and an improved method for performing a test case on an integrated circuit.

SUMMARY OF THE INVENTION

The above object is achieved by a test bench and a method as laid out in the independent claims. Further advantageous embodiments are described in the dependent claims and are provided in the description below.

The core idea of the various embodiments described herein is a combination of a test bench for a direct random simulation and a reference model for a formal verification. This allows validation of the verification environments without the need for a real hardware model as a design under verification. Thus, the method of the various embodiments may be independent from the hardware model.

The reference model may be used as a design under verification. The inputs of the reference model may be simulated by drivers. The outputs of the reference model may be checked by monitors of the random simulation test bench. Thus, the test benches may be cross-validated.

The reference model for the formal verification may be adapted in such a way that the reference model also may be simulated in a simulation environment, which may provide for the verification of an implementation of the hardware specification at the register transfer level. All test cases for the implementation of the hardware specification may be used again. The test bench and method of the various embodiments allow detection and repair of bugs in the reference model.

The bugs in the reference model may be flagged by monitors of the test bench for the direct random simulation. In addition, problems of the drivers and the monitors may be flagged by the reference model. In this way, it is possible to obtain stable verification environments before the hardware design is available. Thus, the verification environments may be developed together with the hardware design so that they do not lag behind the hardware design. Consequently, the discrepancy between the hardware design and the verification environments of the prior art may be resolved before the hardware design matures.

The test bench and the method according to the various embodiments result in a reduction of the verification time required for the design.

BRIEF DESCRIPTION OF THE DRAWINGS

The above as well as additional objectives, features, and advantages of the various embodiments described herein will be apparent in the following detailed written description.

The novel and inventive features of the various embodiments are set forth in the appended claims. Exemplary embodiments and advantages thereof will be best understood by reference to the following detailed description of exemplary embodiments in conjunction with the accompanied drawings, wherein:

DETAILED DESCRIPTION

Figure 1:
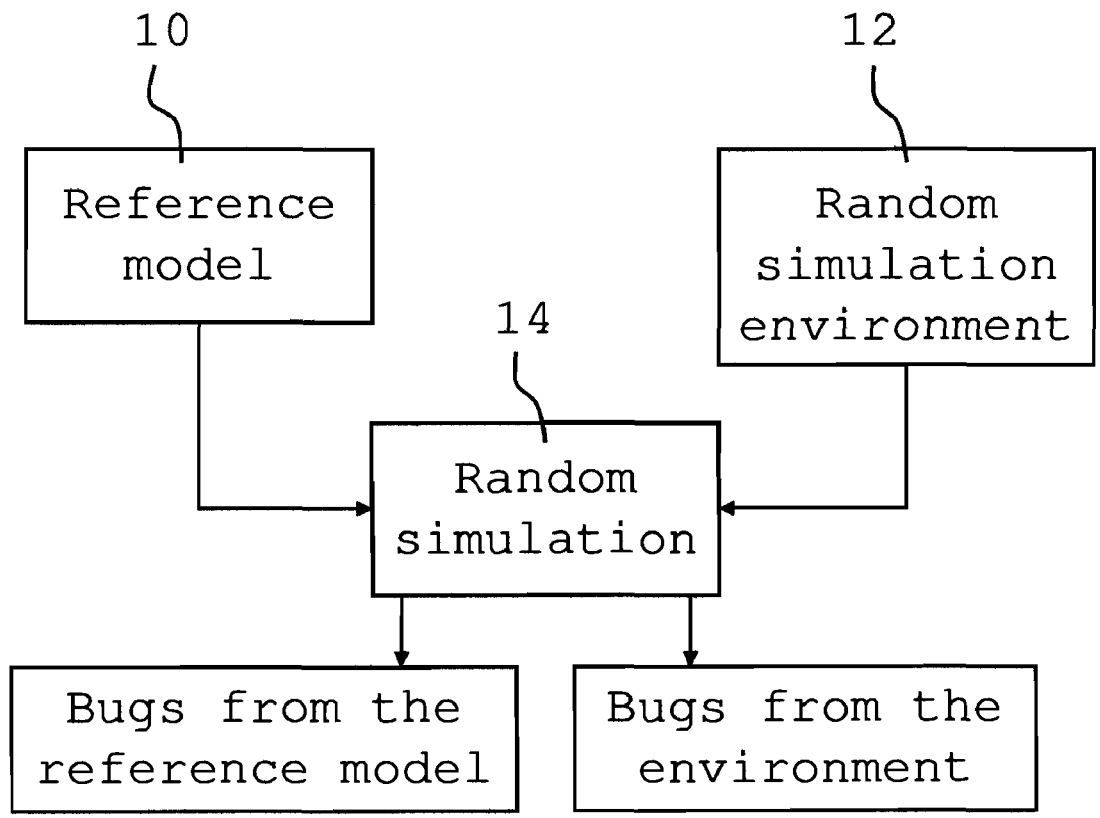
FIG. 1 illustrates a schematic diagram of a test bench and a method for performing a test case according to an exemplary embodiment.

FIG. 1 illustrates a schematic diagram of a test bench and a method for performing a test case according to an exemplary embodiment. The test bench comprises a reference model 10 and a random simulation environment 12. The test bench is provided for performing a random simulation 14.

The reference model 10 and the random simulation environment 12 may be tested by the random simulation 14. The random simulation 14 allows finding bugs in both the reference model 10 and the random simulation environment 12.

The reference model 10 may be coded in a hardware description language (HDL) such as a synthesizable very high speed integrated circuit hardware description language (VHDL). Such VHDL may be compiled by using a standard VHDL compiler, (e.g., "Portals" by IBM). Such VHDL may be compiled into a model, which may be loaded into a Mesa simulator. No change is required to the test bench for the random simulation 14 of the reference model 10.

The HDL of the reference model 10 may be written by a verification team. The storage elements in the HDL, which do not use any clock signals, may be changed. In the simulation, the storage elements may not perform any phase abstractions. The clock signal is generated and controlled in such a way that the simulation is possible.

Since the HDL of the reference model 10 has no control logic, a software module may be used instead of control logic. For example, the driver of a microprocessor may be represented by a suitable software module. It is not necessary to change the logical structure of the simulation environment.

The mapping of the signals may need to be adapted, since the reference model has been changed in accordance with an exemplary embodiment. In fact, some of the former signals are completely absent. Moreover, the structure of the clocking signal may need to be adapted, since the structure of the clocking signal for the reference model may be less complex than the structure of the clocking signal for the hardware model.

Figure 2:
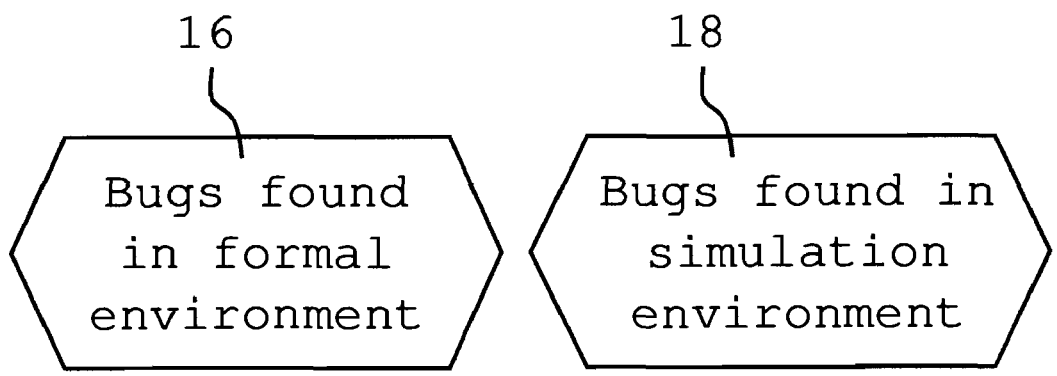
FIG. 2 illustrates a schematic diagram of bugs found by a test case according to an exemplary embodiment.

FIG. 2 illustrates a schematic diagram of bugs found by a test case according to an exemplary embodiment. The bugs 16 found in the formal environment and the bugs 18 found in the simulation environment are provided separately.

The verification environments of an exemplary embodiment may be coded and debugged as soon as the hardware design specification is available. As a result, the verification environments may be developed together with the hardware design so that they do not lag behind the hardware design. Thus, the discrepancy between the hardware design and the verification environments of the prior art may be resolved before the hardware design matures. Consequently, the verification environments are ready to find bugs in the hardware once the first hardware drop is available.

Figure 3:
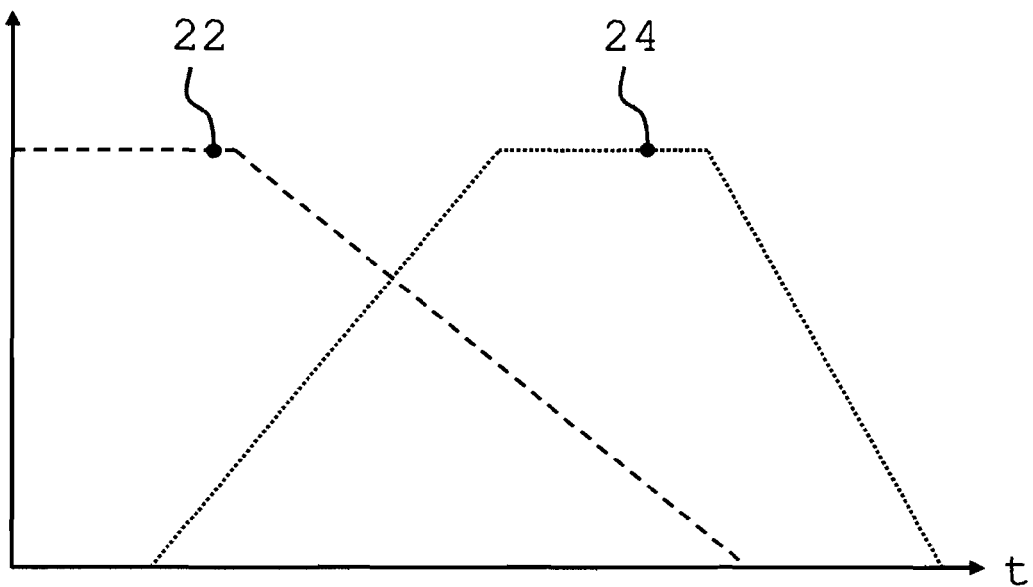
FIG. 3 illustrates a schematic timing diagram of a test case according to the prior art.

FIG. 3 illustrates a schematic timing diagram of a test case according to the prior art. The timing diagram shows the problems occurring in the test bench and test case according to the prior art. A first curve represents the number of found environment bugs 22. A second curve shows the number of found hardware bugs 24. At the beginning of the verification cycle, all occurring bugs are typically environment bugs 22. After a certain time, the test bench is stable enough so that real hardware bugs 24 can be found. Since the bug rate is usually limited by the resources available for verification, the elapsed time before the first hardware bug 24 is found cannot be reduced arbitrarily. This problem is solved by the test bench and method according to exemplary embodiments described above and in the appended claims.

Figure 4:
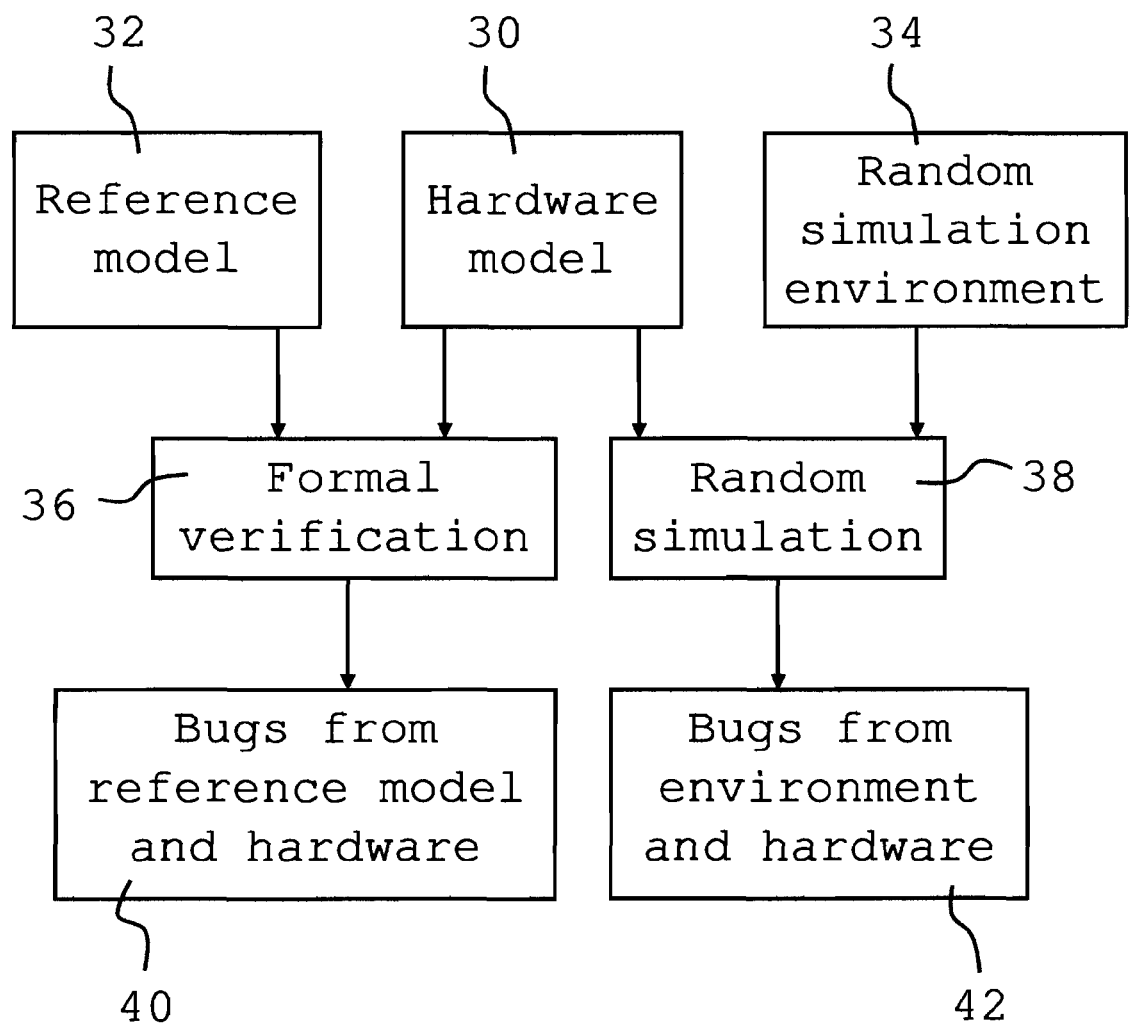
FIG. 4 illustrates a schematic diagram of a test bench and a method for performing a test case according to the prior art.

FIG. 4 illustrates a schematic diagram of a test bench and a method for performing a test case according to the prior art. A hardware model 30, a reference model 32, and a random simulation environment 34 are provided. The hardware model 30 is generated from a hardware description language (HDL). The HDL describes the logic. The hardware model 30 should be synthesized to a semiconductor chip in a later step. Thus, the hardware model 30 contains the logic written by the hardware designer in order to simulate the function in accordance with the relevant specification. The hardware model 30 can be used for a formal verification 36 and for a random simulation 38 of the random simulation environment 34. The hardware model 30 and the random simulation environment 34 are two different models provided for different types of simulations. The hardware model 30 and the random simulation environment 34 are logically based on the HDL provided for synthesizing a semiconductor chip.

The HDL of the reference model 32 according to the prior art is created by a verification team. The reference model 32 is also provided to simulate the function according to the specification. The reference model 32 may comprise elements of a higher level, which are not synthesizable. The HDL of the reference model 32 is written only for checking the hardware model 30.

The formal verification 36 can ensure that the reference model 32 and the hardware model 30 are equivalent. Usually, the reference model 32 describes only a part of the logic of the device under test. Specifically, the reference model 32 typically describes such parts of the logic that are suitable for the formal verification 36. For example, the data path of a microprocessor may be described by the reference model 32. Such part is compared with a corresponding part of the hardware model 30.

The formal verification 36 finds bugs 40 in both the reference model 32 and the hardware model 30. The random simulation 38 finds bugs 42 in both the random simulation environment 34 and the hardware model 30.

The hardware model 30 is simulated randomly by the random simulation 38, and the obtained results are compared with expectation values. The expectation values may be obtained from a database with test values.

The failures in the formal verification may be due to bugs in both the reference model 32 and the real hardware. The failures in the random simulation may be due to bugs in both the random simulation environment 34 and the real hardware.

The hardware model 30 of the prior art (see FIG. 4) is not required for the test bench and the method according to the various embodiments described herein. Rather, for the various embodiments, the modified reference model 10 may be tested by the random simulation 14 together with the random simulation environment 12 (see FIG. 1).

Figure 5:
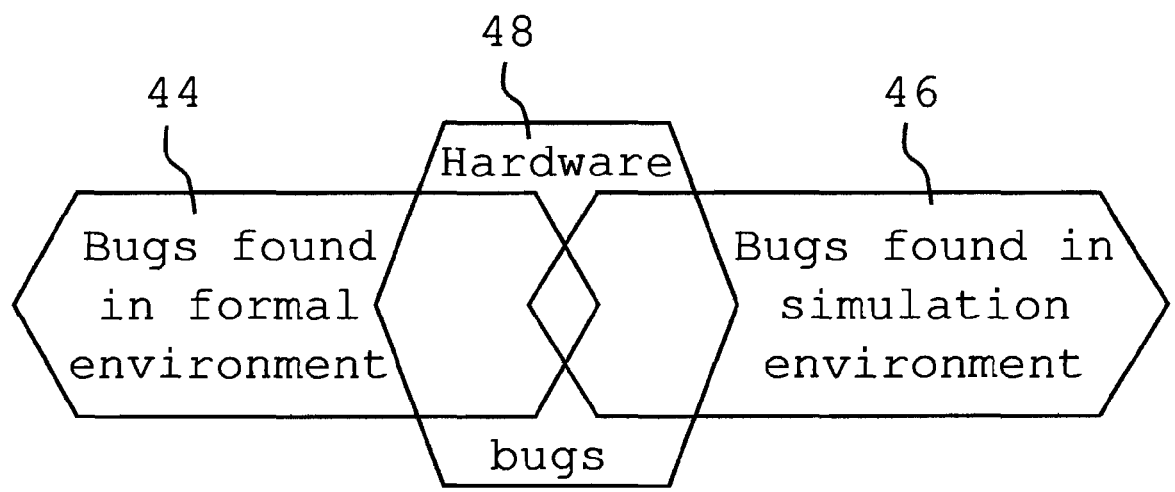
FIG. 5 illustrates a schematic diagram of bugs found by a test case according to the prior art.

FIG. 5 illustrates a schematic diagram according to the prior art of the relation between the bugs 44 found in the formal environment and the bugs 46 found in the simulation environment. The bugs 48 in the real hardware are partially found in the formal environment 44 and partially found in the simulation environment 46. Some bugs may be found by both verification environments, as depicted by the overlapping areas of 44 and 46. A further part of the bugs 48 in the real hardware may not be found in either verification environment.

Figure 6:
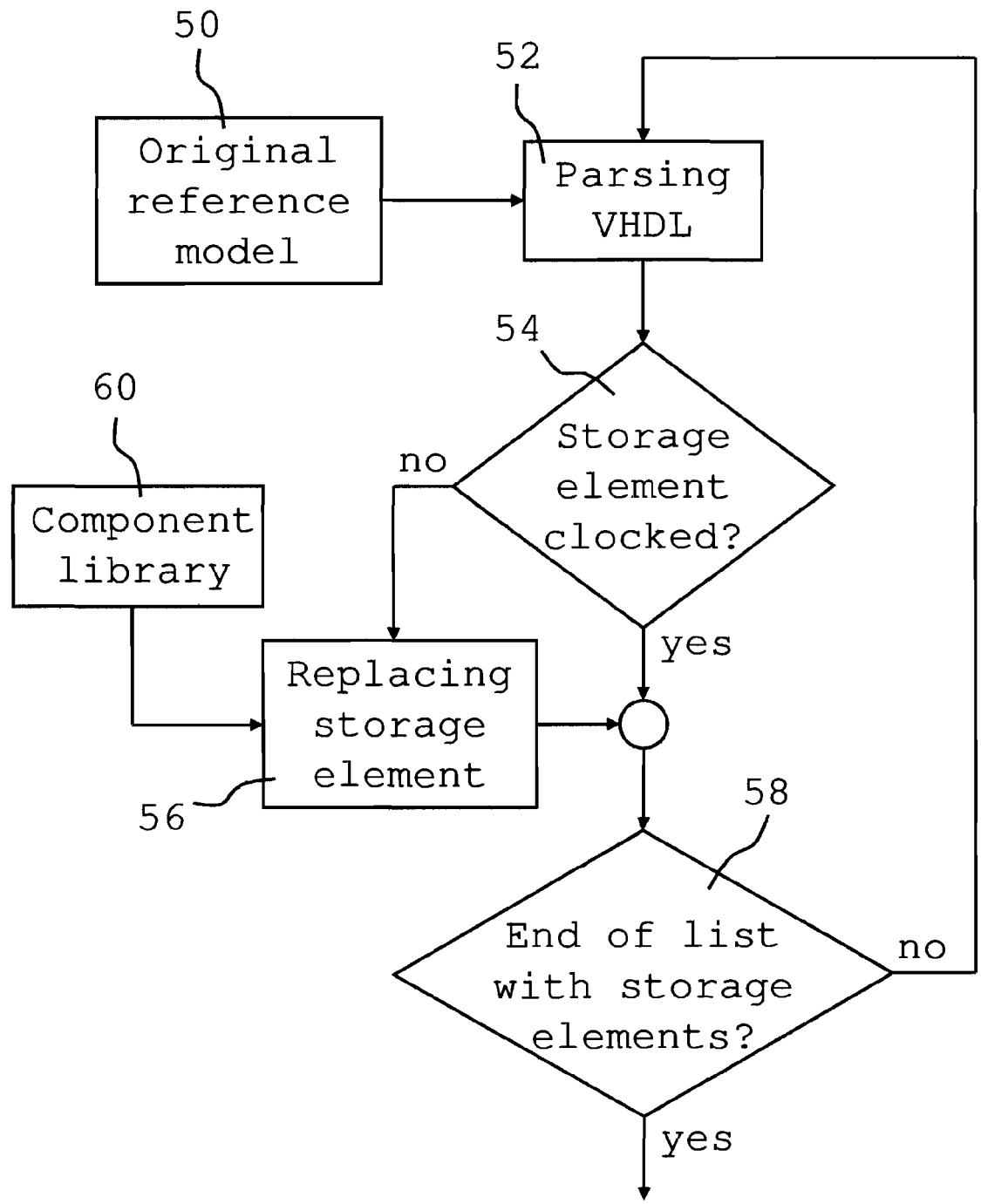
FIG. 6 illustrates a flow chart diagram of a first part of a generation of a reference model from an original reference model according to an exemplary embodiment.

FIG. 6 illustrates a flow chart diagram of a first part of the generation of the reference model 10 from an original reference model 50 according to an exemplary embodiment. The reference model 10 as generated from the original reference model 50 may be used in the random simulation 14 (see FIG. 1).

In a step 52, the VHDL description of the original reference model 50 may be parsed, and as a result the storage elements may be extracted and processed. In a further step 54, it may be determined whether the storage element being processed is clocked; specifically, clock connections may be checked to determine whether a functional clock input exists. In order to achieve the correct functional simulation, it is necessary to ensure that each storage element has functional clock signals and is connected to a functional clock tree.

If no functional clock input exists for the storage element being processed, the storage element may be replaced in a step 56 by an equivalent storage element from a component library 60. A replacement list may be maintained in order to find corresponding storage elements in the component library 60. The replacement list may be very small, since only a few types of storage elements are used in the original reference model 50. If there is a functional clock input in the step 54, then the process may proceed to a step 58. In the step 58, it may be determined whether an end of the list of storage elements has been reached. If the end of the list has not yet been reached, then the process illustrated in FIG. 6, beginning with the step 52, may be repeated for the next storage element to be processed. If the end of the list has been reached, then the first part of the generation of the reference model 10 may end.

Figure 7:
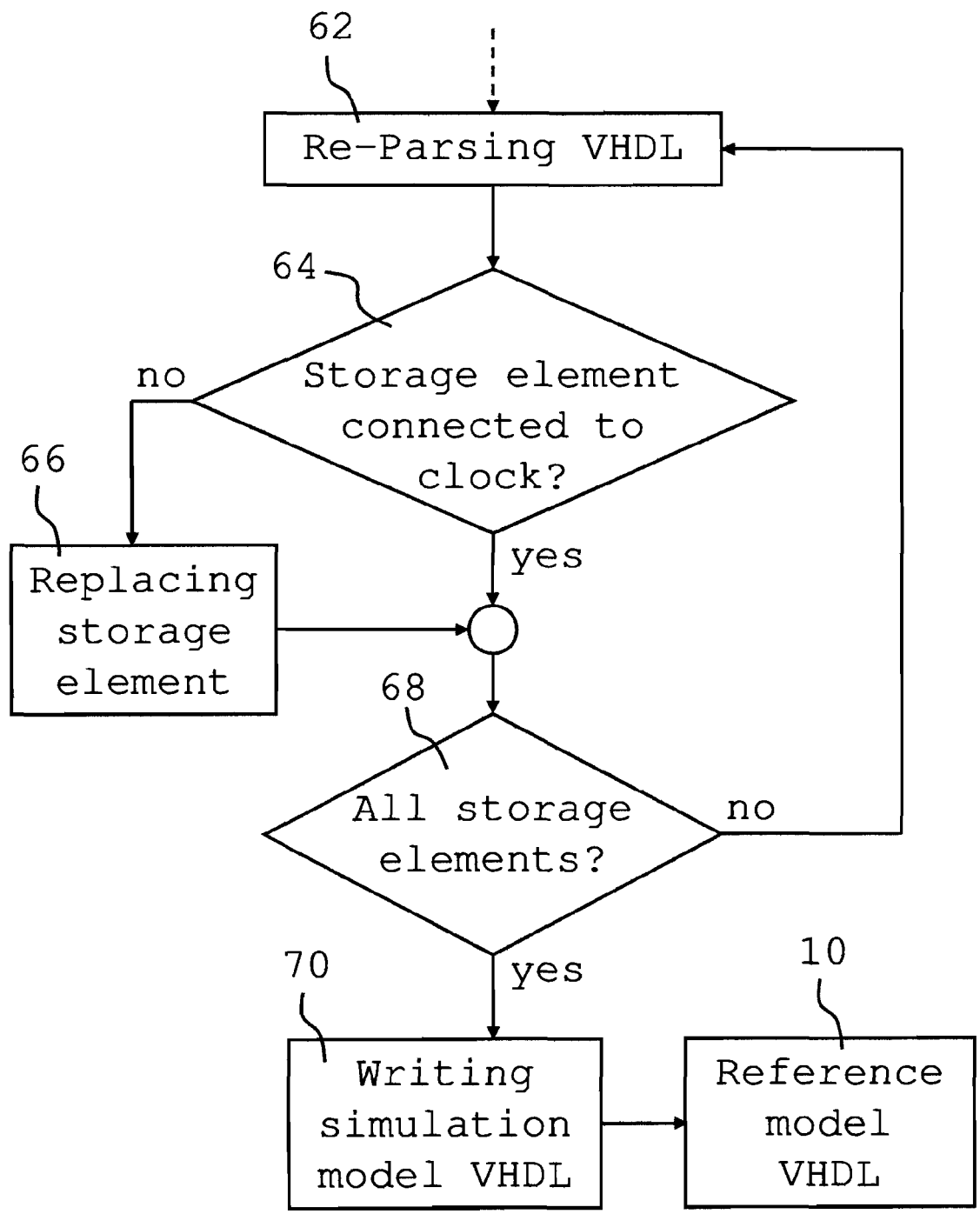
FIG. 7 illustrates a flow chart diagram of a second part of the generation of the reference model from the original reference model according to an exemplary embodiment.

FIG. 7 illustrates a flow chart diagram of a second part of the generation of the reference model 10 from the original reference model 50 according to an exemplary embodiment. In a step 62, VHDL description of the original reference model 50 may be re-parsed in order to extract the storage elements, and subsequently in a step 64 clock connections for each storage element may be checked again to determine whether a functional clock input exists. If the clock inputs of a storage element are open (i.e., if a functional clock input does not exist), then in a step 66 a VHDL connection to the functional clock may be inserted into the VHDL source. Subsequently, in a step 68 it may be determined whether an end of the list of storage elements has been reached. If an end of the list has not been reached, then the process returns to the step 62, and the process illustrated in FIG. 7, including re-parsing the VHDL description, is repeated. The process as illustrated in FIG. 7 is a brute force approach that entails iterating through all storage elements until all storage elements have been processed.

In an optimized process according to another exemplary embodiment, the storage elements, which require clock connections, may be added to a list while re-parsing the VHDL description for the first time, and then such list may be worked through in a further step, thus eliminating the need to re-parse for each storage element. Such an optimized process may eliminate the need for the brute force approach depicted in FIG. 7.

After all storage elements are connected to the clock tree, the VHDL source for the model build process may be written into a file in a step 70. Subsequently, the resulting VHDL may be compiled into the reference model 10 by using a standard model build process script. The standard model build process script may invoke the standard VHDL compiler (e.g., "Portals" by IBM) in order to compile the resulting VHDL description into the reference model 10.

Figure 8:
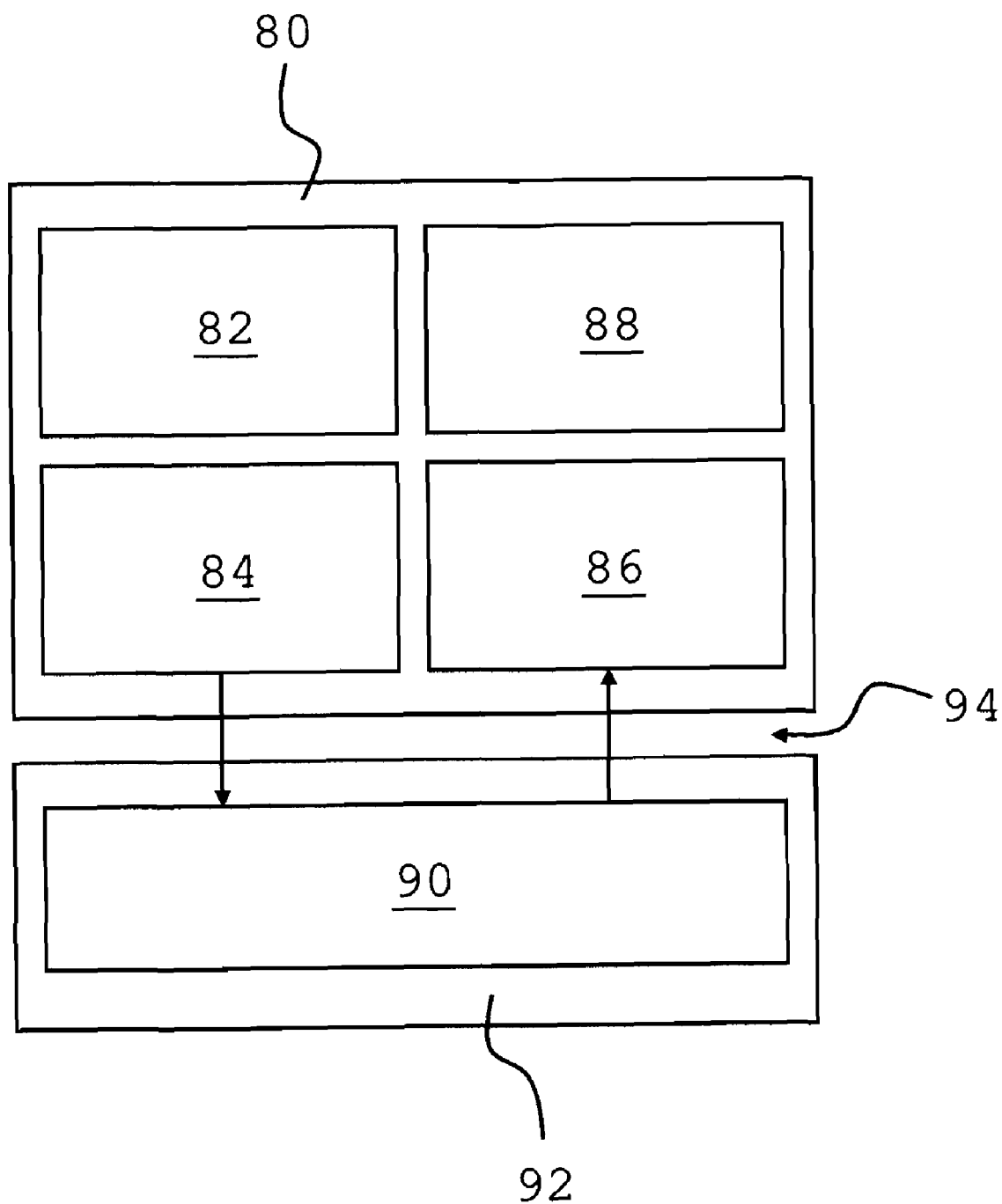
FIG. 8 illustrates a schematic diagram of a typical structure for a simulation environment according to an exemplary embodiment.

FIG. 8 illustrates a schematic diagram of a typical structure for a simulation environment 80 according to an exemplary embodiment. The simulation environment 80 may include a test generator 82, a port driver 84, an interface monitor 86, and a unit monitor 88. The simulation environment 80 may be connected to a device under verification 90 integrated within a simulator 92. The device under verification 90 may be a device to be verified. According to an exemplary embodiment, the reference model 10 may be the device under verification 90. However, in the prior art, the hardware model 30 is used as the device under verification 90.

The test generator 82 may generate random sequences of operations. The random sequences may be used to simulate the device under verification 90. The port driver 84 may translate the operations into corresponding sequences for the input signals of an interface 94. All signals of the interface 94 may be monitored by the interface monitor 86. The unit monitor 88 may be used to check the correct operation of the device under verification 90.

If control logic does not completely exist in the reference model 10, then it is now possible either to add the missing parts of the logic to the existing simulation port driver code or to replace the port driver 84 completely. The port driver 84 may be the only part directly connected to the interface of the device under verification 90. Furthermore, the port driver 84 may be the least complex part of the user code. Thus, the complete replacement of the port driver 84 is a minor modification of the simulation environment 80.

Another modification of the simulation environment 80 may be necessary for the alias file to map the real facility names to the names of the simulation code. For example, the simulation code may be written in the programming language C++. In such case, the expression "//Alias entry for simulation model from the real hardware design: sim_facility TopLevel.Core.Unit.Facility" should be changed to "//Alias entry for simulation model from the formal reference model: sim_facility TopLevel.Behavior.Facility". An alternative involving the least effort would be to maintain a second modified copy of the existing alias file.

The modulus of the simulation code should be executed at the correct time so that the simulation code works correctly. Such timely execution may be achieved by registering the code of a given clock signal. For example, "Register_Interface_Monitor (Driver, evaluate, "SimRiseClock", "Core")" may associate a piece of the code to a specific block. In this example, the "evaluate" function of "Driver" is called at the rising edge of the "Core" clock signal.

The reference model may not contain all of the functional clock signals in a design, but rather may contain only a simplified subset of all clock signals. Therefore, it may be necessary to modify the corresponding "Register" instructions in the simulation code to the simplified clock structure of the reference model. For example, if the hardware model contains three clocks Core1, Core2, and Core3, and the reference model contains only one clock named Core, then all "Register" instructions should be changed to refer to clock Core.

The various embodiments described herein may be realized in hardware, software, or a combination of hardware and software. The various embodiments described herein may be embedded in a computer program product that comprises all the features enabling the implementation of the methods described herein. Further, when loaded in computer system, the computer program product is able to carry out these methods.

Although exemplary embodiments have been described herein with reference to the accompanying drawings, it is to be understood that the disclosure is not limited to those precise embodiments, and that various other changes and modifications may be performed therein by one skilled in the art without departing from the scope or spirit of the disclosure. All such changes and modifications are intended to be included within the scope of the disclosure as defined by the appended claims.

The invention claimed is:

1. A test bench for performing a test case on an integrated circuit, the test bench comprising:
   a simulation environment representing an environment for implementing the integrated circuit;
   a reference model of the integrated circuit that is based on an original reference model provided for a formal verification and that is prepared for running within the simulation environment by replacing at least one un-clocked storage element extracted from the original reference model with an equivalent clocked storage element; and
   a device for running a simulation on the reference model within the simulation environment, the device including one or more processors.

2. The test bench according to claim 1, wherein the simulation environment is a random simulation environment.

3. The test bench according to claim 1, wherein the simulation environment enables verification of a hardware implementation at the register transfer level.

4. The test bench according to claim 1, wherein the reference model is based on a hardware description language (HDL) description of the integrated circuit.

5. The test bench according to claim 1, wherein the reference model comprises at least one controllable clocking signal.

6. The test bench according to claim 1, wherein the reference model comprises at least one software module representing at least one control logic circuit.

7. The test bench according to claim 1, wherein the test bench is realized in at least one of hardware and a combination of hardware and software.

8. A computer-implemented method for performing a test case on an integrated circuit, the method comprising:
   providing a simulation environment representing an environment for implementing the integrated circuit;
   providing an original reference model for a formal verification;
   preparing a reference model that is based on the original reference model and that can be run within the simulation environment by replacing at least one un-clocked storage element extracted from the original reference model with an equivalent clocked storage element; and running a simulation on the reference model within the simulation environment to find bugs in a formal environment and bugs in the simulation environment.

9. The method according to claim 8, wherein the simulation environment is a random simulation environment.

10. The method according to claim 8, wherein the simulation environment enables verification of a hardware implementation at the register transfer level.

11. The method according to claim 8, wherein the reference model is provided on the basis of a hardware description language (HDL) description of the integrated circuit.

12. The method according to claim 8, wherein the reference model is prepared with at least one controllable clocking signal.

13. The method according to claim 8, wherein the reference model is prepared with at least one software module representing at least one control logic circuit.

14. The method according to claim 8, wherein the method is realized in at least one of hardware and a combination of hardware and software.

15. A computer program product stored on a non-transitory computer-usable medium, comprising a computer readable-program causing a computer to implement a test bench, the test bench comprising:

a simulation environment representing an environment for implementing the integrated circuit;

a reference model of the integrated circuit that is based on an original reference model provided for a formal verification and that is prepared for running within the simulation environment by replacing at least one un-clocked storage element extracted from the original reference model with an equivalent clocked storage element; and a device for running a simulation on the reference model within the simulation environment.

16. The computer program product according to claim 15, wherein the simulation environment enables verification of a hardware implementation at the register transfer level.

17. The computer program product according to claim 15, wherein the reference model is based on a hardware description language (HDL) description of the integrated circuit.

18. A non-transitory computer-usable medium storing an application, which, when executed on a processor, completes an operation for performing a test case on an integrated circuit, the operation comprising:

providing a simulation environment representing an environment for implementing the integrated circuit;

providing an original reference model for a formal verification;

preparing a reference model that is based on the original reference model and that can be run within the simulation environment by replacing at least one un-clocked storage element extracted from the original reference model with an equivalent clocked storage element; and running a simulation on the reference model within the simulation environment to find bugs in a formal environment and bugs in the simulation environment.

19. The non-transitory computer-usable medium according to claim 18, wherein the simulation environment enables verification of a hardware implementation at the register transfer level.

20. The non-transitory computer-usable medium according to claim 18, wherein the reference model is based on a hardware description language (HDL) description of the integrated circuit.

* * * * *